(12) United States Patent
Van Lankvelt et al.

(10) Patent No.: US 10,545,414 B2
(45) Date of Patent: Jan. 28, 2020

(54) VIBRATION ISOLATION SYSTEM AND LITHOGRAPHIC APPARATUS

(71) Applicant: ASML Netherlands B.V., Veldhoven (NL)

(72) Inventors: Alexander Petrus Josephus Van Lankvelt, Veghel (NL); Ingmar August Kerp, Eindhoven (NL); Richardus Simon Antonius Oostveen, Malden (NL); Marco Hendrikus Hermanus Oude Nijhuis, Eindhoven (NL); Robertus Mathijs Gerardus Rijs, Sevenum (NL); Olav Johannes Seijger, Veldhoven (NL); Alexander Maurice Steenhoek, Duizel (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/767,524

(22) PCT Filed: Oct. 26, 2016

(86) PCT No.: PCT/EP2016/075769
§ 371 (c)(1),
(2) Date: Apr. 11, 2018

(87) PCT Pub. No.: WO2017/080823
PCT Pub. Date: May 18, 2017

(65) Prior Publication Data
US 2018/0299783 A1 Oct. 18, 2018

(30) Foreign Application Priority Data
Nov. 10, 2015 (EP) ..................................... 15193855

(51) Int. Cl.
*G03B 27/42* (2006.01)
*B64C 17/06* (2006.01)
(Continued)

(52) U.S. Cl.
CPC .............. *G03F 7/709* (2013.01); *F16F 15/02* (2013.01); *F16J 15/52* (2013.01);
(Continued)

(58) Field of Classification Search
CPC combination set(s) only.
See application file for complete search history.

(56) References Cited

U.S. PATENT DOCUMENTS 4,523,612 A 6/1985 Kuklo
4,833,899 A 5/1989 Tugal
(Continued)

FOREIGN PATENT DOCUMENTS

EP 1503246 A2 2/2005
GB 1096461 A 12/1967
(Continued)

OTHER PUBLICATIONS

International Search Report and Written Opinion of the International Searching Authority directed to related International Patent Application No. PCT/EP2016/075659, dated May 18, 2017; 12 pages.
(Continued)

*Primary Examiner* — Mesfin T Asfaw
(74) *Attorney, Agent, or Firm* — Sterne, Kessler, Goldstein & Fox P.L.L.C.

(57) ABSTRACT

The invention relates to a vibration isolation system (VIS) comprising: —a base (10); —a coupling element (20) to be coupled to a vibration sensitive object; —a vibration isolator (30-34) arranged between the base and the coupling element; —a bellows (50) to be arranged between the VIS
(Continued)

coupling element or the vibration isolator and a protective housing (40) surrounding the vibration sensitive object; and
—one or more separate damping elements to act on convolutions of the bellows.

13 Claims, 5 Drawing Sheets

(51) Int. Cl.
  *G03F 7/20* (2006.01)
  *F16F 15/02* (2006.01)
  *F16J 15/52* (2006.01)
(52) U.S. Cl.
  CPC ...... *G03F 7/70341* (2013.01); *G03F 7/70775* (2013.01); *G03F 7/70825* (2013.01); *G03F 7/70833* (2013.01)

(56) References Cited

U.S. PATENT DOCUMENTS

| | | |
|---|---|---|
| 6,774,374 B1 | 8/2004 | Driessen et al. |
| 2003/0155882 A1 | 8/2003 | Ono et al. |
| 2005/0035684 A1 | 2/2005 | Fuse et al. |
| 2005/0189727 A1 | 9/2005 | Smith |
| 2009/0045620 A1 | 2/2009 | Cipra |

FOREIGN PATENT DOCUMENTS

| | | |
|---|---|---|
| JP | S59-067849 U | 5/1984 |
| JP | 2001-193879 A | 7/2001 |
| JP | 2005-026264 A | 1/2005 |
| JP | 2005-064474 A | 3/2005 |
| JP | 2011-058608 A | 3/2011 |
| JP | 2013-144997 A | 7/2013 |

OTHER PUBLICATIONS

International Preliminary Report on Patentability directed to related International Patent Application No. PCT/EP2016/075659, dated May 15, 2018; 8 pages.
Smith et al., "Rubber-Coated Bellows Improves Vibration Damping in Vacuum Lines," NASA Tech Brief, May 1, 1966, Brief 66-10187; 2 pages.
"Type of Bellows," JHM, http://jhmde.com/expansion-joint-gallery/type-of-bellows/?lang=en, 2014; 4 pages.
Japanese Search Report by Registered Search Organization with English-language Translation attached from related Japanese Patent Application No. 2018-517893, dated May 29, 2019; 27 pages.
International Search Report and Written Opinion of the International Searching Authority directed to related International Patent Application No. PCT/EP2016/075769, dated Jan. 26, 2017; 12 pages.
International Preliminary Report on Patentability directed to related International Patent Application No. PCT/EP2016/075769, dated May 15, 2018; 8 pages.

VIBRATION ISOLATION SYSTEM AND LITHOGRAPHIC APPARATUS

CROSS-REFERENCE TO RELATED APPLICATIONS

This application claims priority of EP application 15193855.2 which was filed on 10 Nov. 2015 and which is incorporated herein in its entirety by reference.

BACKGROUND

Field of the Invention

The present invention relates to a vibration isolation system and a lithographic apparatus comprising such a vibration isolation system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During the transfer of the pattern vibrations may deteriorate the transferred image. It is therefore important that the vibration sensitive lithographic apparatus or a vibration sensitive part thereof are supported on a basis by a vibration isolation system which isolates the sensitive part from base vibrations.

However, in case the sensitive part requires specific conditions other than the environment, e.g. vacuum conditions, a protective housing may be provided surrounding the sensitive part which may introduce vibrations via the vibration isolation system.

SUMMARY

It is desirable to provide an improved vibration isolation system which isolates the sensitive part from base vibrations and from protective housing vibrations.

According to an embodiment of the invention, there is provided a vibration isolation system comprising:
 a base;
 a coupling element to be coupled to a vibration sensitive object;
 a vibration isolator arranged between the base and the coupling element;
 a bellows to be arranged between the coupling element or the vibration isolator and a protective housing surrounding the vibration sensitive object; and
 one or more separate damping elements to act on convolutions of the bellows, wherein the one or more separate damping elements are constructed to lower a combined dynamic stiffness of the bellows including separate damping elements to below a dynamic stiffness of the vibration isolator for a predetermined frequency range.

According to another embodiment of the invention, there is provided a lithographic apparatus comprising:
 a base frame;
 a metrology frame supporting vibration sensitive equipment;
 a protective housing surrounding the metrology frame, wherein the protective housing is carried by the base frame;
 a vibration isolation system comprising:
  a base mounted to or part of the base frame;
  a coupling element coupled to the metrology frame;
  a vibration isolator arranged between the base and the coupling element;
  a bellows arranged between the coupling element or the vibration isolator and the protective housing; and
  one or more separate damping elements to act on convolutions of the bellows, wherein the one or more separate damping elements are constructed to lower a combined dynamic stiffness of the bellows including separate damping elements to below a dynamic stiffness of the vibration isolator for a predetermined frequency range.

According to yet another embodiment of the invention, there is provided a lithographic apparatus comprising:
 an illumination system configured to condition a radiation beam;
 a base frame;
 a support frame carrying the illumination system;
 a protective housing surrounding the support frame, wherein the protective housing is carried by the base frame;
 a vibration isolation system comprising:
  a base mounted to or part of the base frame;
  a coupling element coupled to the support frame;
  a vibration isolator arranged between the base and the coupling element;
  a bellows arranged between the coupling element or the vibration isolator and the protective housing; and
  one or more separate damping elements to act on convolutions of the bellows, wherein the one or more separate damping elements are constructed to lower a combined dynamic stiffness of the bellows including separate damping elements to below a dynamic stiffness of the vibration isolator for a predetermined frequency range.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
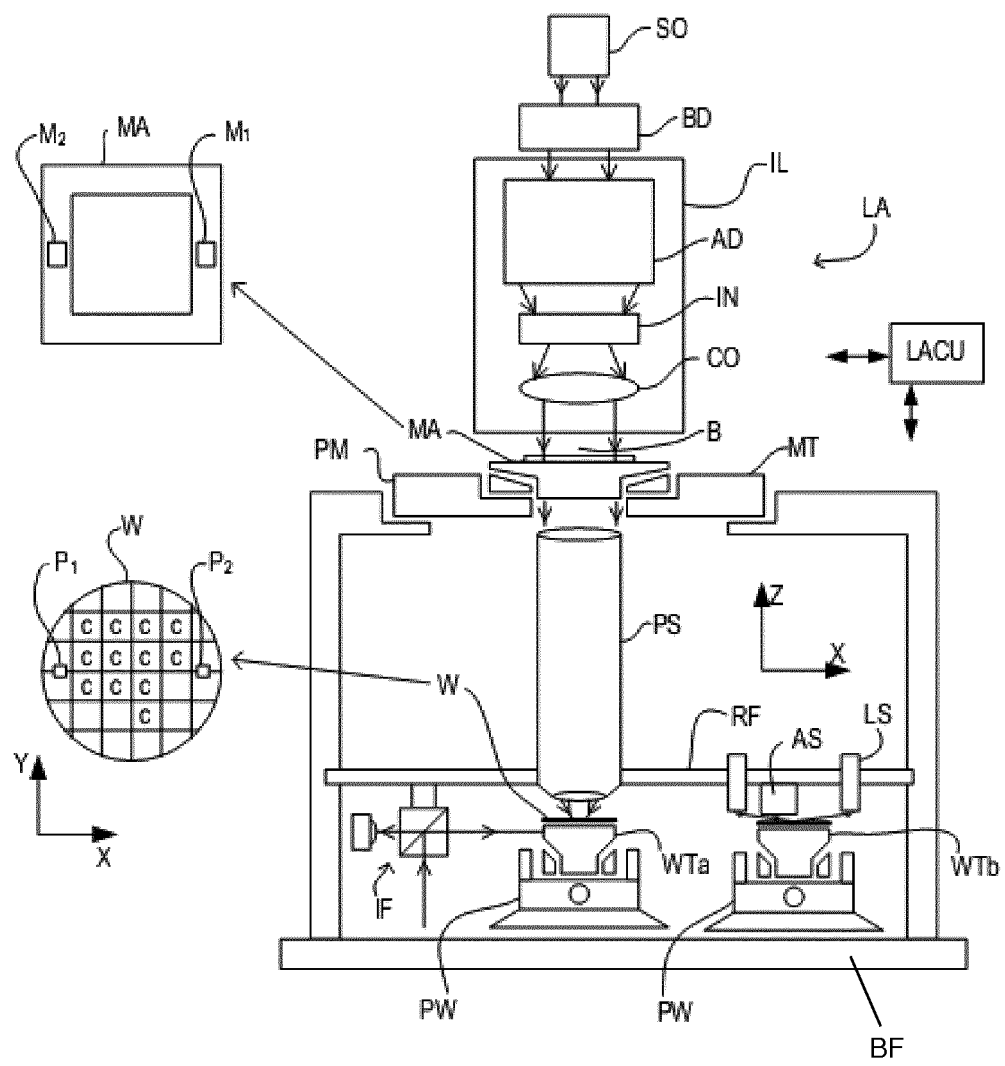
FIGS. 1 and 6 depict a lithographic apparatus according to some embodiments of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, and/or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Vibrations acting on the abovementioned equipment, especially the projection system PS and sensors measuring the position of substrates and patterning devices, may deteriorate the image transferred from the patterning device MA to the substrate W. The projection system PS and sensors AS, LS and IF are therefore arranged on a metrology frame RF supported on a base frame BF by one or more vibration isolation systems (not shown here) to isolate the metrology frame RF and thereby the equipment on the metrology frame from vibrations in the base frame BF.

Figure 2:
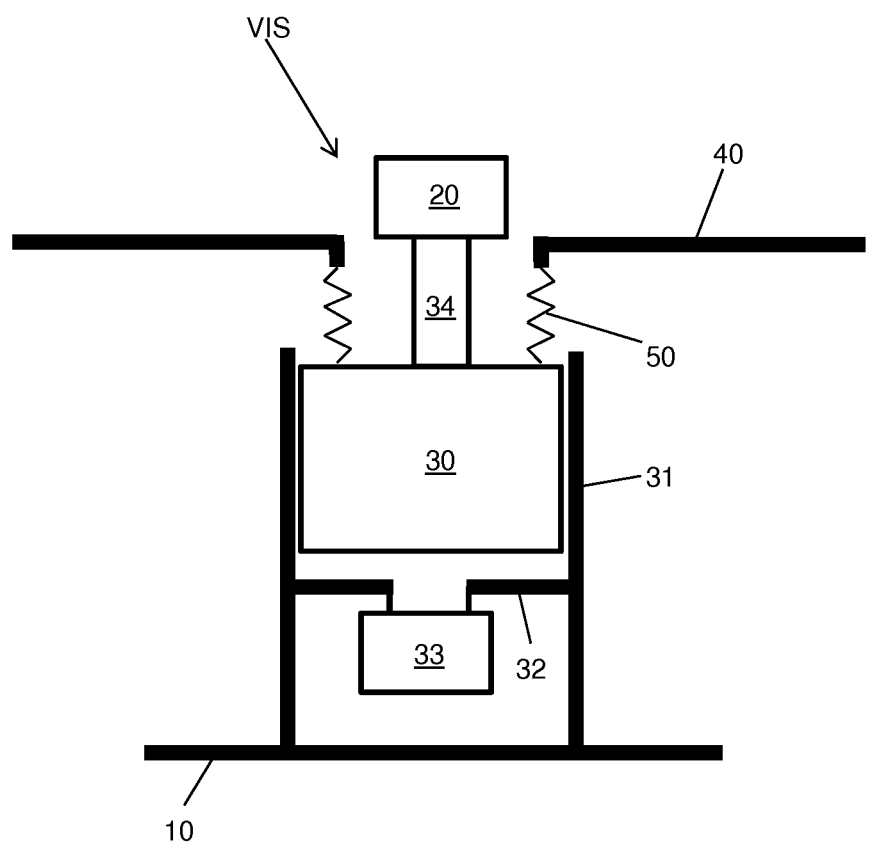
FIG. 2 depicts schematically a vibration isolation system according to an embodiment of the invention.

FIG. 2 depicts schematically a vibration isolation system VIS as described above with reference to FIG. 1. The vibration isolation system VIS comprises a base 10 that can be mounted to or be part of the base frame BF shown in FIG. 1.

The system VIS further comprises a coupling element 20 to be coupled to a vibration sensitive object, e.g. the metrology frame RF shown in FIG. 1. In between the coupling element 20 and the base 10, a vibration isolator is arranged. In this embodiment, the vibration isolator comprises an pneumatic device, e.g. an airmount, including a piston 30, a cylinder 31 with a bottom 32, and a compressor 33. The piston 30 is able to move freely within the cylinder 31 in Z-direction and a rotational direction about the Z-direction, so-called Rz-direction, and is supported from the bottom 32 of the cylinder by compressed air provided between the bottom 32 and piston 30 by the compressor 33. Compressed air from the compressor is also provided between the piston 30 and the cylinder 31 thereby forming an air bearing providing stiffness in the X-, Y-, Rx- and Ry-direction, wherein the Rx- and Ry-direction correspond to rotations about the X-direction and Y-direction, respectively. The pneumatic device thereby provides an air spring between the coupling element and the base to isolate the coupling element from vibrations in Z-direction. When three or more vibration isolation systems VIS are used to support the metrology frame, the metrology frame is isolated from vibrations in Z-direction as well as vibrations in Rx- and Ry-direction.

In this embodiment, the vibration isolator also comprises a rod 34 arranged between the piston 30 and the coupling element 20 allowing to isolate the coupling element from vibrations in X and/or Y directions as well.

It is explicitly noted that the number and type of vibration isolator components is not essential to the invention. Hence, a vibration isolator comprising active devices controllable in such a manner that the coupling element is effectively isolated from vibrations in the base also falls within the scope of this invention and disclosure.

In order to increase the accuracy of the lithographic apparatus, a protective housing 40 is preferably provided around the metrology frame separating the inside environment from the outside environment. This allows for instance to have vacuum conditions around the metrology frame and equipment carried thereby. The separation between the inside and outside also has to be provided at the location of the vibration isolation system. For this purpose a bellows 50 is used.

The bellows 50 is in this embodiment arranged between the vibration isolator, i.e. the piston 30, and the protective housing 40 thereby providing an air tight separation while isolating the vibration isolator from vibrations of the protective housing 40. The protective housing 40 may be carried by the base frame BF, as is generally the case, so that vibrations in the base frame BF can easily be transferred to the protective housing 40. The bellows 50 is provided to prevent vibrations in the base frame to enter the metrology frame RF via the protective housing 40.

Although not shown, the vibration isolation system VIS in FIG. 2 further comprises one or more separate damping elements to act on convolutions of the bellows 50, wherein the one or more damping elements are constructed to lower a combined dynamic stiffness of the bellows including separate damping elements to below a dynamic stiffness of the vibration isolator for a predetermined frequency range.

Figure 3:
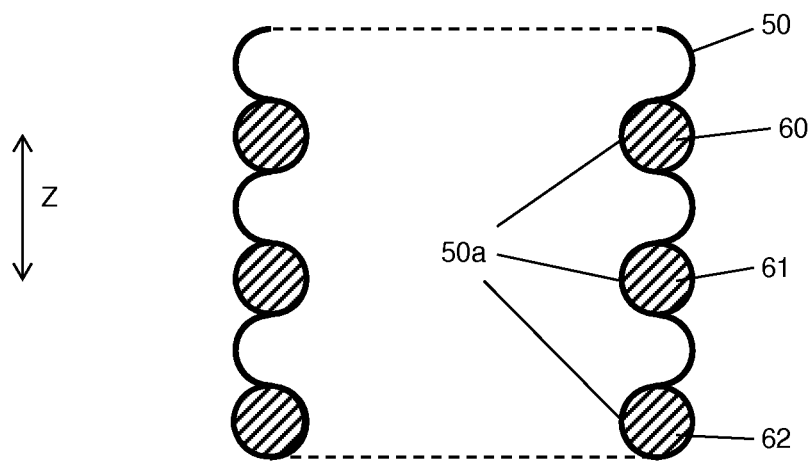
FIG. 3 depicts an example of a bellows with separate damping elements suitable to be used in the vibration isolation system of FIG. 2.

An example of a bellows with separate damping elements is shown in FIG. 3. FIG. 3 depicts a cross-sectional view of a bellows 50 with convolutions, in this case a regular pattern of periodic convolutions 50 a. The convolutions provide flexibility to the bellows with a relatively low stiffness. The static stiffness of the bellows 50 itself is preferably lower than the static stiffness of the vibration isolator, more preferably at most 50%, even more preferably at most 20%, and most preferably at most 10% of the static stiffness of the vibration isolator.

O rings 60, 61, 62 are provided in the convolutions 50 a as separate damping elements, in this case externally of the bellows. To this end, the O rings may comprise viscoelastic material. An example of a suitable viscoelastic material is Viton (a registered trademark of DuPont Performance Elastomers L.L.C.), a brand of synthetic rubber and fluoropolymer elastomer, e.g., comprising copolymers of hexafluoropropylene, vynilidene fluoride, terpolymers of tetrafluoroethylene, vynilidene fluoride and hexafluoropropylene as well as perfluoromethylvinylether containing specialties, preferably with a fluorine content between 66 and 70%.

Although in FIG. 3 all external grooves of the convolutions are filled with O rings, it is explicitly noted that this is not required in all situations. When for instance the first eigenmode of the bellows is a relevant eigenmode, meaning that the dynamic stiffness of the bellows for the first eigenmode without separate damping elements is above the dynamic stiffness of the vibration isolator, the upper and lower convolutions will be subjected to a higher deformation than the middle convolution. It may then also be sufficient to provide only damping elements that act on the upper and lower convolution, i.e. for the embodiment in FIG. 3, only the upper and lower O ring may be provided and the middle O ring may be omitted. An advantage thereof is that sufficient damping is added to the bellows without increasing the static stiffness too much.

Figure 4:
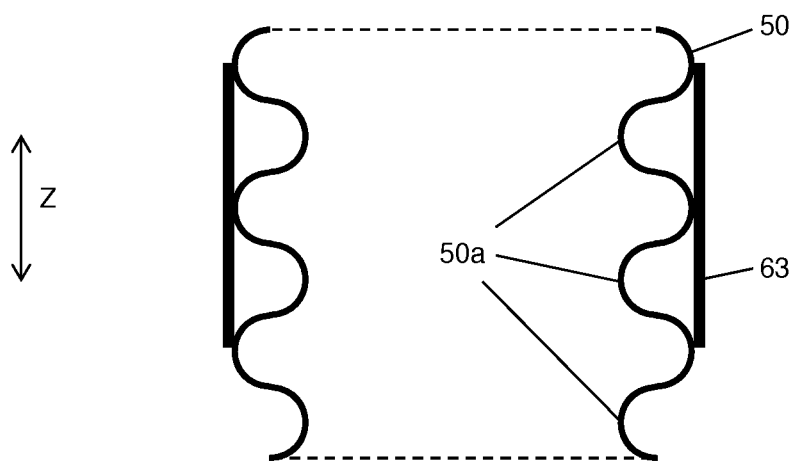
FIG. 4 depicts another example of a bellows with separate damping elements suitable to be used in the vibration isolation system of FIG. 2.

FIG. 4 depicts another example of a bellows with separate damping elements. FIG. 4 depicts a cross-sectional view of a bellows 50 with convolutions, in this case a regular pattern of periodic convolutions 50 a.

On the outside of the bellows, a damping elements 63 are connected to the convolutions 50 a, which damping elements preferably comprise viscoelastic material.

Where for FIG. 3 an alternative embodiment is described in which the middle O ring is omitted, a similar embodiment is possible for the situation of FIG. 4 when damping element 63 is only connected to the upper and lower convolution and not connected to the middle convolution.

The one or more damping elements as shown in FIGS. 3 and 4 are able to result in a reduction of the dynamic stiffness of the combined bellows and damping elements compared to the bellows without damping elements for a predetermined frequency range, e.g. 0.1-2000 Hz, 0.1-1000 Hz, 0.5-1000 Hz or 0.5-2000 Hz. This is shown by reference to FIG. 5.

Figure 5:
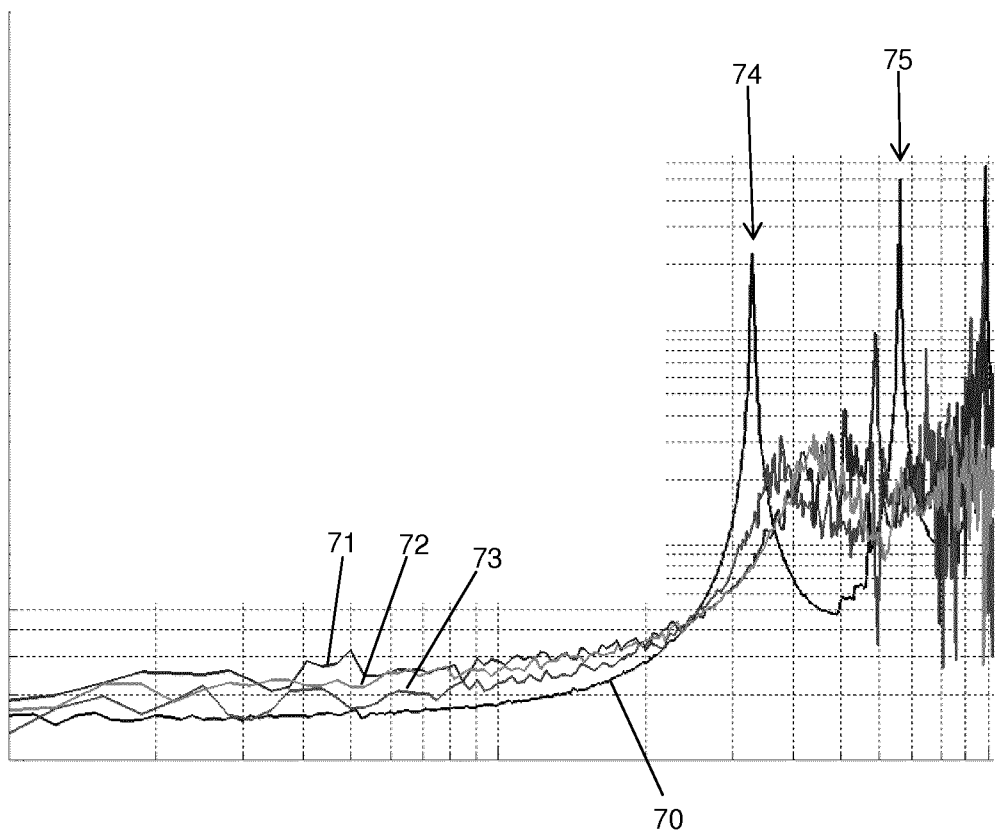
FIG. 5 depicts an example of the effect of the separate damping elements on the dynamic stiffness.
Figure 6:
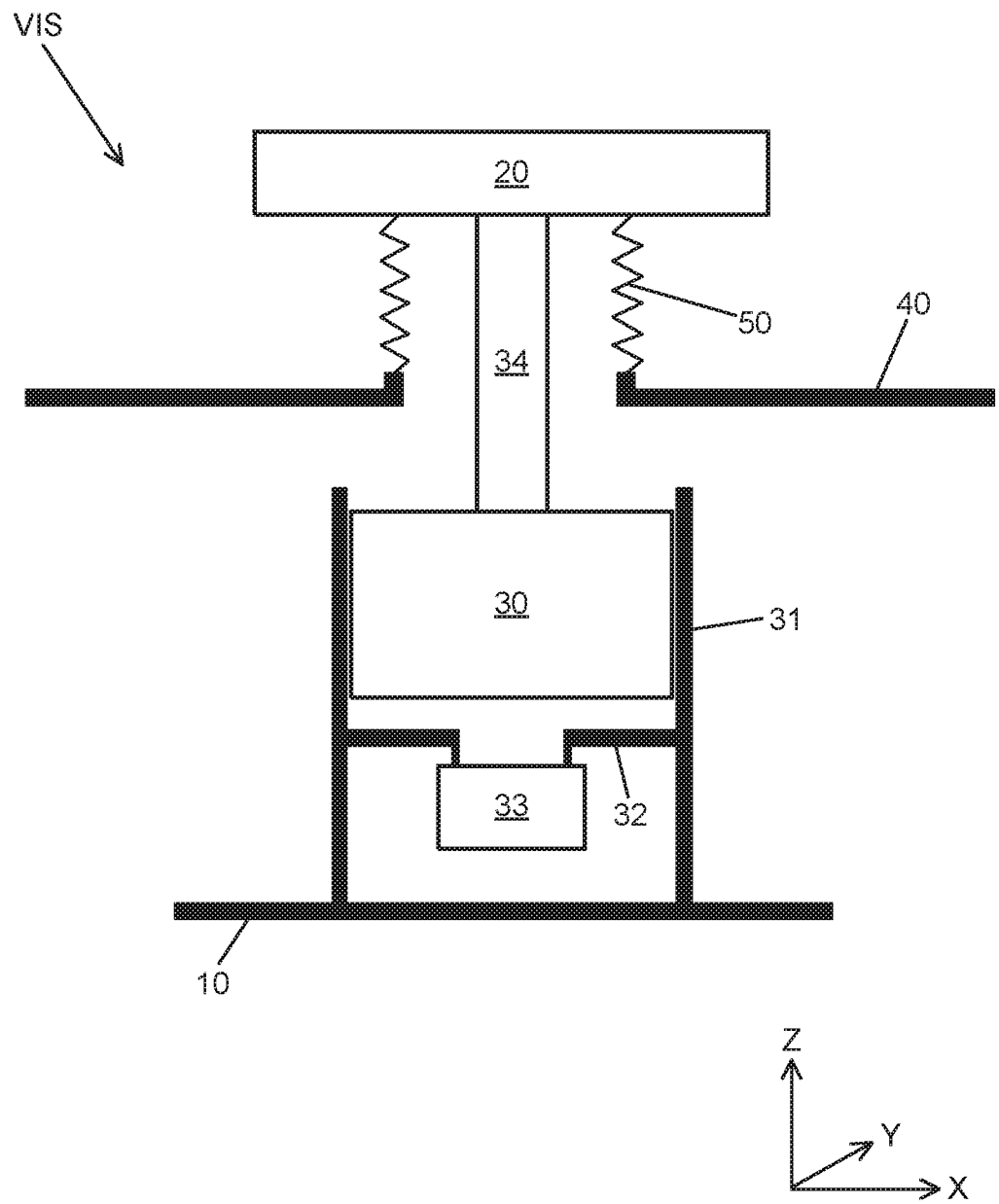

FIG. 5 depicts an actual measurement of dynamic stiffness of a bellows according to the invention for a predetermined frequency range of interest, where the line 70 corresponds to the bellows without damping elements, and lines 71, 72 and 73 correspond to experiments with different types of damping elements, e.g. shown schematically in FIGS. 3 and 4.

The line 70 comprises peaks 74 and 75 where the dynamic stiffness may be above the dynamic stiffness of the vibration isolator, thus relating to relevant eigenmodes. As a result thereof, vibrations in the protective housing may be transferred to the metrology frame with such an amplitude that the vibrations have a significant negative influence on system performance.

By adding the damping elements the combined dynamic stiffness of the bellows including separate damping elements can be lowered to below a dynamic stiffness of the vibration isolator for a predetermined frequency range. This is clearly shown for the lines 71, 72 and 73 which have a considerable lower dynamic stiffness in the region of the peaks 74 and 75. As a result thereof, the vibration isolation properties of the vibration isolation system are improved and the lithographic apparatus is able to meet its specifications or to perform under better conditions. Preferably, the combined dynamic stiffness of the bellows including separate damping elements is a factor two smaller than the dynamic stiffness of the vibration isolator in the predetermined frequency range, preferably a factor five, and more preferably a factor ten.

The predetermined frequency range may alternatively be defined as a frequency range including one or more eigenmodes of the bellows without damping elements.

Although specific embodiments have been shown in which the projection system and sensors are supported by vibration isolation systems according to the invention, it is also possible that the invention is applied to other vibration sensitive parts of the lithographic apparatus. An example thereof is the illumination system IL, see FIG. 1. Hence, the lithographic apparatus may comprise a base frame carrying a support frame in turn carrying the illumination system IL, wherein one or more vibration isolation systems according to the invention are provided in between the base frame and the support frame. A protective housing may be provided surrounding the support frame and illumination system, wherein the protective housing is carried by the base frame. The bellows of the one or more vibration isolation systems are then provided in between the respective coupling elements or vibration isolators and the protective housing.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A vibration isolation system comprising:
   a base;
   a coupling element configured to be coupled to a vibration sensitive object;
   a vibration isolator arranged between the base and the coupling element;
   a bellows configured to be arranged between the coupling element or the vibration isolator and a protective housing surrounding the vibration sensitive object; and
   one or more separate damping elements configured to act on convolutions of the bellows,
   wherein the one or more separate damping elements are configured to lower a combined dynamic stiffness of the bellows including the separate damping elements to below a dynamic stiffness of the vibration isolator for a predetermined frequency range.

2. The vibration isolation system of claim 1, wherein:
   the one or more separate damping elements only act on the convolutions of the bellows that are subject to relatively high deformations for a relevant eigenmode; and
   the relevant eigenmode is defined as an eigenmode within the predetermined frequency range for which a dynamic stiffness of the bellows without separate damping elements is above the dynamic stiffness of the vibration isolator.

3. The vibration isolation system of claim 1, wherein the one or more separate damping elements are O rings arranged in the convolutions.

4. The vibration isolation system of claim 3, wherein the O rings are arranged externally of the bellows.

5. The vibration isolation system of claim 1, wherein the vibration isolator comprises an airmount.

6. The vibration isolation system of claim 1, wherein the predetermined frequency range is approximately 0.1 Hz to 2000 Hz.

7. The vibration isolation system of claim 1, wherein a static stiffness of the bellows without separate damping elements is about 20% of a static stiffness of the vibrator isolator.

8. The vibration isolation system of claim 1, wherein the combined dynamic stiffness of the bellows including separate damping elements is a factor two smaller than the dynamic stiffness of the vibration isolator in the predetermined frequency range, wherein the factor is a factor five or a factor ten.

9. A lithographic apparatus comprising:
   a base frame;
   a metrology frame supporting vibration sensitive equipment;
   a protective housing surrounding the metrology frame, wherein the protective housing is carried by the base frame; and
   a vibration isolation system comprising:
   a base;

a coupling element configured to be coupled to a vibration sensitive object;

a vibration isolator arranged between the base and the coupling element;

a bellows configured to be arranged between the coupling element or the vibration isolator and a protective housing surrounding the vibration sensitive object; and one or more separate damping elements configured to act on convolutions of the bellows, wherein the one or more separate damping elements are constructed to lower a combined dynamic stiffness of the bellows including the one or more separate damping elements to below a dynamic stiffness of the vibration isolator for a predetermined frequency range, wherein the base of the vibration isolation system is mounted to or part of the base frame, wherein the coupling element of the vibration isolation system is coupled to the metrology frame; and wherein the bellows is arranged between the coupling element or the vibration isolator and the protective housing.

10. A lithographic apparatus of claim 9, wherein the protective housing is configured to keep a vacuum around the metrology frame.

11. The lithographic apparatus of claim 9, wherein multiple vibration isolation systems are provided between the base frame and the metrology frame.

12. The lithographic apparatus of claim 9, further comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the projection system is arranged on the metrology frame.

13. A lithographic apparatus comprising:

an illumination system configured to condition a radiation beam;

a base frame;

a support frame carrying the illumination system;

a protective housing surrounding the support frame, wherein the protective housing is carried by the base frame;

a vibration isolation system comprising:
  a base;
  a coupling element configured to be coupled to a vibration sensitive object;
  a vibration isolator arranged between the base and the coupling element;
  a bellows configured to be arranged between the coupling element or the vibration isolator and a protective housing surrounding the vibration sensitive object; and
  one or more separate damping elements to act on convolutions of the bellows,
  wherein the one or more separate damping elements are constructed to lower a combined dynamic stiffness of the bellows including the separate damping elements to below a dynamic stiffness of the vibration isolator for a predetermined frequency range,
  wherein the base of the vibration isolation system is mounted to or part of the base frame,
  wherein the coupling element of the vibration isolation system is coupled to the support frame, and
  wherein the bellows is arranged between the coupling element or vibration isolator and the protective housing.

* * * * *